United States Patent
Hata et al.

(10) Patent No.: US 10,612,973 B2
(45) Date of Patent: Apr. 7, 2020

(54) LIGHT DETECTION DEVICE

(71) Applicant: DENSO CORPORATION, Kariya, Aichi-pref. (JP)

(72) Inventors: Takehiro Hata, Kariya (JP); Shinji Kashiwada, Kariya (JP); Akifumi Ueno, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 79 days.

(21) Appl. No.: 16/013,047

(22) Filed: Jun. 20, 2018

(65) Prior Publication Data

US 2018/0372538 A1 Dec. 27, 2018

(30) Foreign Application Priority Data

Jun. 22, 2017 (JP) ................................ 2017-122285

(51) Int. Cl.
*H03K 5/1534* (2006.01)
*G01J 1/44* (2006.01)

(52) U.S. Cl.
CPC .............. *G01J 1/44* (2013.01); *H03K 5/1534* (2013.01); *G01J 2001/442* (2013.01); *G01J 2001/4466* (2013.01)

(58) Field of Classification Search
CPC ................. G04F 10/005; H03K 5/1534; G01J 2001/4466

See application file for complete search history.

(56) References Cited

U.S. PATENT DOCUMENTS

| | | |
|---|---|---|
| 2010/0020209 A1 | 1/2010 | Kim |
| 2012/0068077 A1 | 3/2012 | Frach et al. |
| 2013/0120623 A1 | 5/2013 | Kim |
| 2014/0103196 A1 | 4/2014 | Soga et al. |
| 2014/0175294 A1 | 6/2014 | Frach |
| 2014/0336987 A1 | 11/2014 | Frach et al. |
| 2018/0123611 A1* | 5/2018 | Dutton ...................... G01J 1/44 |

FOREIGN PATENT DOCUMENTS

| | | |
|---|---|---|
| JP | 2010-035168 A1 | 2/2010 |
| JP | 2012-528321 A1 | 11/2012 |
| JP | 2014-081253 A1 | 5/2014 |
| JP | 2014-081254 A1 | 5/2014 |
| JP | 2014-529923 A1 | 11/2014 |
| JP | 2017-044663 A1 | 3/2017 |
| JP | 2017-053833 A1 | 3/2017 |
| JP | 2018-182051 | 11/2018 |

\* cited by examiner

*Primary Examiner* — Thanh Luu
(74) *Attorney, Agent, or Firm* — Knobbe, Martens, Olson & Bear, LLP

(57) ABSTRACT

A light detection device has light receiving parts, edge detection circuits and an addition unit. Each light receiving part has a quench resistance, a SPAD and a pulse signal output part. The SPAD responses incident photons, i.e. incident light. The quench resistance and pulse signal output part generate and transmit a pulse signal to a corresponding edge detection circuit when the SPAD receives and responds to the incident light. The edge detection circuits and the addition unit detects the number of edges during a period from a previously received CLK signal to a currently received CLK signal every time it receives a CLK signal transmitted at a predetermined period. The edge represents a state change from a first state which receives no pulse signal to a second state which receives the pulse signal.

12 Claims, 15 Drawing Sheets

FIG.13
LARGE AMOUNT OF INCIDENT LIGHT
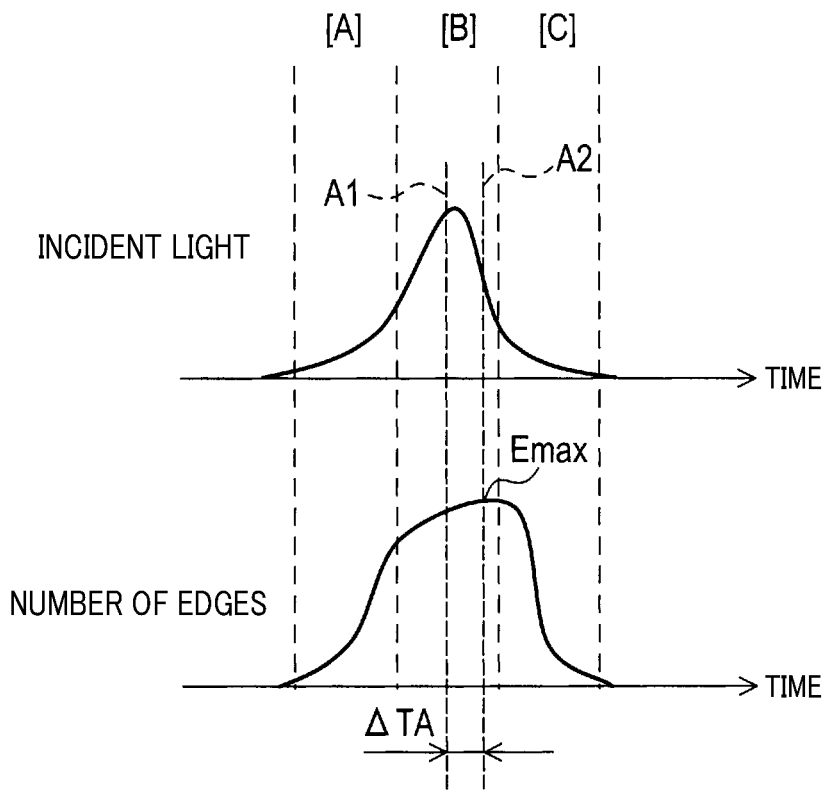
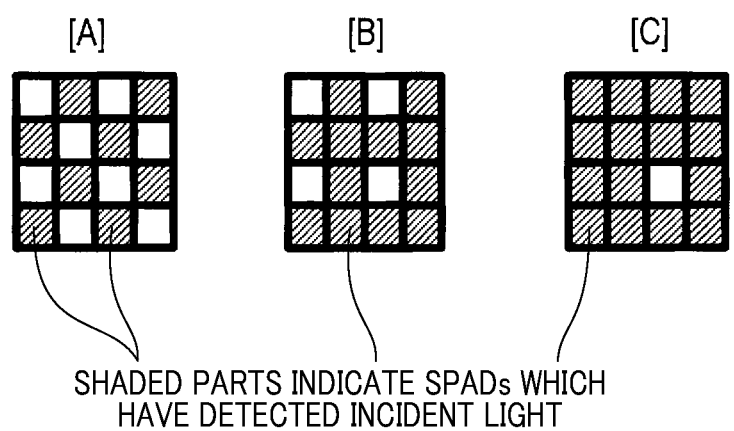
SHADED PARTS INDICATE SPADs WHICH
HAVE DETECTED INCIDENT LIGHT

FIG.14
SMALL AMOUNT OF INCIDENT LIGHT
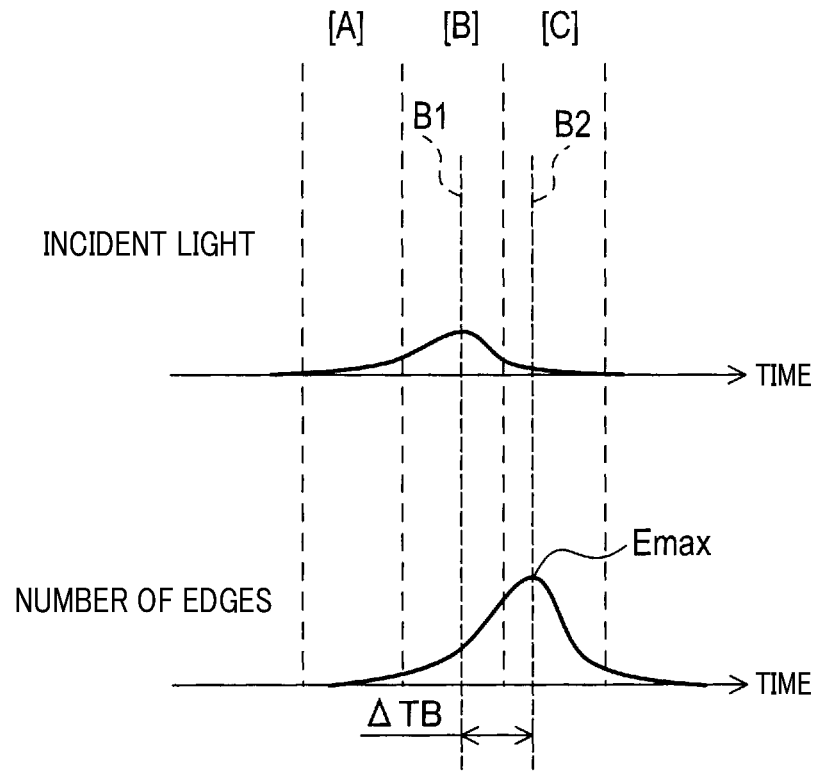
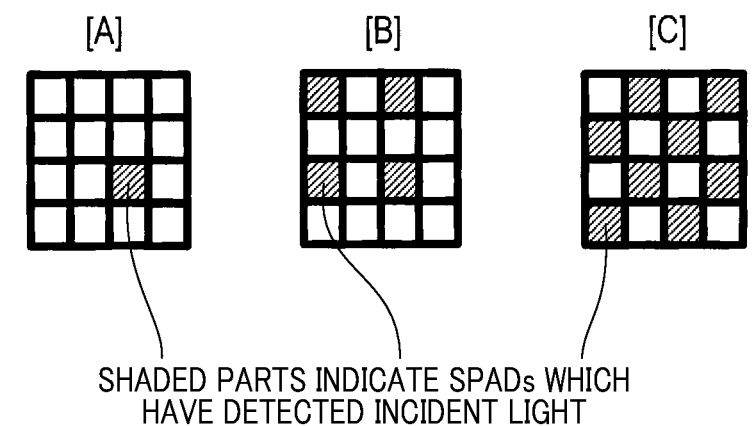
SHADED PARTS INDICATE SPADs WHICH
HAVE DETECTED INCIDENT LIGHT

LIGHT DETECTION DEVICE

CROSS-REFERENCE TO RELATED APPLICATION

This application is related to and claims priority from Japanese Patent Application No. 2017-122285 filed on Jun. 22, 2017, the contents of which are hereby incorporated by reference.

BACKGROUND OF THE INVENTION

1. Field of the Invention

The present invention relates to light detection devices equipped with single photon avalanche diodes (SPADs) as solid state sensitive photodetectors or semiconductor devices capable of detecting incident light, i.e. incident photons.

2. Description of the Related Art

Patent document 1 regarding a related art, Japanese patent laid open publication No. 2014-081253 discloses a conventional technique of detecting incident light by using a plurality of single photon avalanche diodes (SPADs) on the basis of response results of the SPADs to the incident light. The SPADs operate in synchronization with clock signals (CLK signals) transmitted at a predetermined period. The related art technique counts the number of the SPADs which respond to the incident light received in synchronization with the clock signals. It can be considered that the stronger the strength of incident light is, the more the number of the SPADs which respond to the incident light increases.

However, the related art technique has a tendency to delay a peak timing of the number of times for the SPADs to detect, i.e. respond to incident light from a true timing when the intensity of the incident light has a peak value due to elongating a period for the SPADs to transmit pulse signals. Accordingly, it is difficult for the related art technique of the patent document 1 to correctly estimate the light detection timing with high accuracy when the SPADs detect incident light on the basis of the number of the SPADs which respond to the incident light.

SUMMARY

It is therefore desired to provide a light detection device equipped with single photon avalanche diodes (SPADs) capable of estimating a light detection timing when the SPADs have detected incident light, i.e. incident photons.

In accordance with one aspect of the present invention, there is provided a light detection device capable of detecting incident photons, i.e. incident light. The light detection device has a plurality of light receiving parts and a plurality of edge detection parts. Each of the plurality of light receiving parts has a single photon avalanche diode or a SPAD configured to detect incident photons or incident light, and a signal output part. The signal output part is configured to generate and transmit a pulse signal when the SPAD responds to the incident photons or incident light.

The plurality of edge detection parts are arranged in one to one correspondence with the plurality of light receiving parts. The plurality of edge detection parts are configured to detect the number of edges during a period counted from a previously received clock signal to a currently received clock signal every time it receives the clock signal transmitted at a predetermined period. Each edge represents a change from a first state to a second state. In the first state, the signal output part transmits no pulse signal to the corresponding edge detection part. In the second state, the signal output part transmits the pulse signal to the edge detection part.

Because the light detection device having the structure previously described detects the number of edges every time it receives the clock signal, it is possible to avoid the influence of SPAD's response time during the time period in which the SPADs receive and respond to the incident photons, i.e. the incident light when compared with a light detection device according to a related art which detects only the number of times for the SPADs to detect, i.e. to respond to incident light. It is possible for the light detection device according to the present invention to estimate the light detection timing when the light detection device detects incident light with high accuracy because the light detection timing is detected on the basis of the number of edges.

BRIEF DESCRIPTION OF THE DRAWINGS

A preferred, non-limiting embodiment of the present invention will be described by way of example with reference to the accompanying drawings, in which:

FIG. 13 is a view showing a SPAD response example when the light detection device according to a sixth exemplary embodiment of the present invention receives incident light having a strong intensity;

FIG. 14 is a view showing a SPAD response example when the light detection device according to the sixth exemplary embodiment of the present invention receives incident light having a weak intensity.

DETAILED DESCRIPTION OF THE PREFERRED EMBODIMENTS

Figure 1:
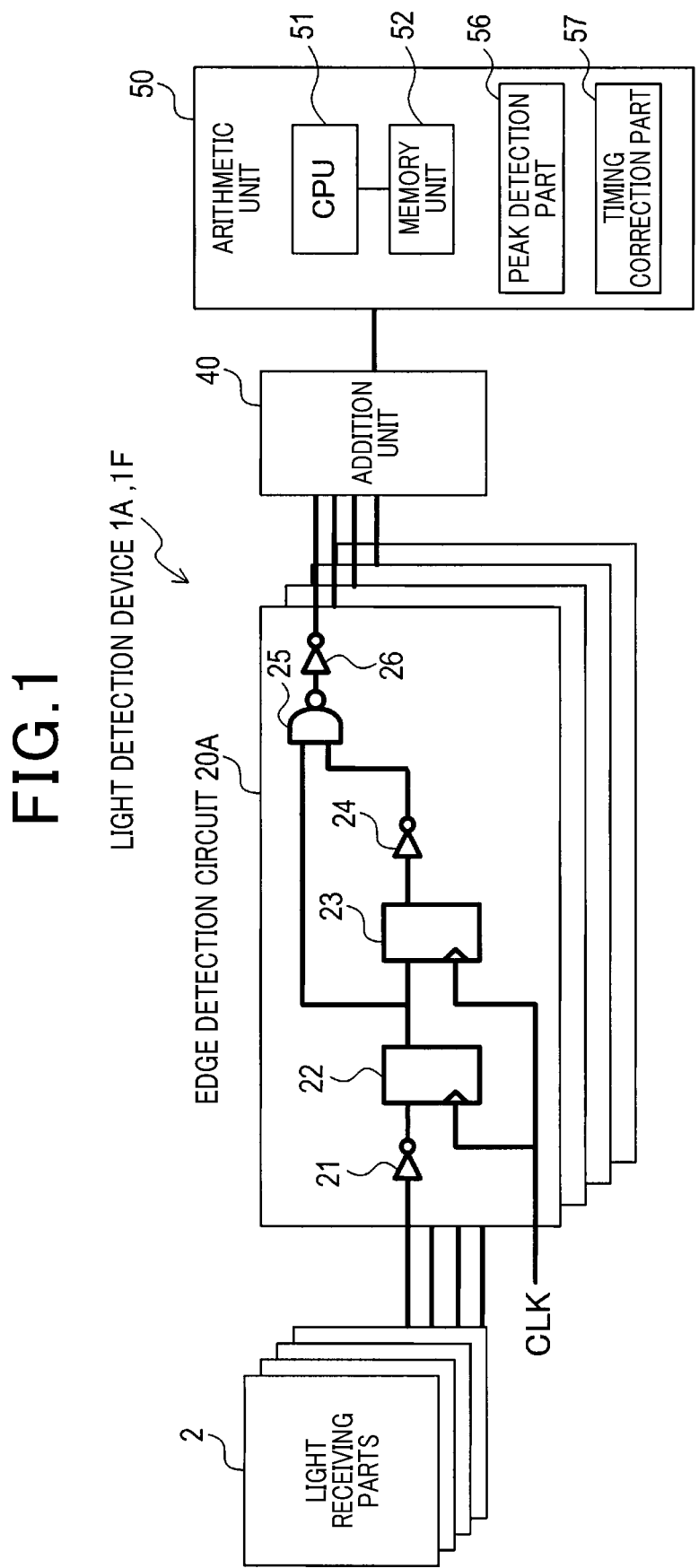
FIG. 1 is a block diagram showing a structure of a light detection device according to a first exemplary embodiment of the present invention.

Hereinafter, various embodiments of the present invention will be described with reference to the accompanying drawings. In the following description of the various embodiments, like reference characters or numerals designate like or equivalent component parts throughout the several diagrams.

First Exemplary Embodiment

A description will be given of a light detection device 1A according to a first exemplary embodiment of the present invention with reference to FIG. 1 to FIG. 6.
(Structure of the Light Detection Device 1A)

FIG. 1 is a block diagram showing a structure of the light detection device 1A according to the first exemplary embodiment. As shown in FIG. 1, the light detection device 1A according to the first exemplary embodiment has a plurality of light receiving parts 2 and a plurality of edge detection circuits 20A. In the light detection device 1A, each of the light receiving parts 2 is equipped with an avalanche photodiode (hereinafter, the APD) such as a single photon avalanche diode (hereinafter, the SPAD). The SPAD is capable of detecting incident light, i.e. incident photons. Hereinafter, the incident light corresponds to incident photons.

The SPAD in each light receiving part 2 is used in a laser radar device capable of emitting a laser beam. For example, the SPAD detects a period of time counted from an emitting time when the laser beam is emitted from the laser radar device and to a receiving time when the laser radar device receives a reflected laser beam, which has been reflected by an object. That is, the laser radar device emits such a laser beam toward the object, and receives a reflected laser beam reflected by the object.

The SPAD starts to operate when receiving a breakdown voltage as a reverse bias voltage. Because the SPAD causes the breakdown thereof when receiving incident light, i.e. incident photons, the light detection device 1A is configured to detect a voltage change when a breakdown occurs in the SPAD and to generate and transmit a digital pulse (hereinafter, the pulse signal) having a predetermined pulse width.

In addition to this structure of the light detection device 1 shown in FIG. 1, it is acceptable for the light detection device 1A to further have an addition unit 40 and an arithmetic unit 50 shown in FIG. 1.

Figure 2:
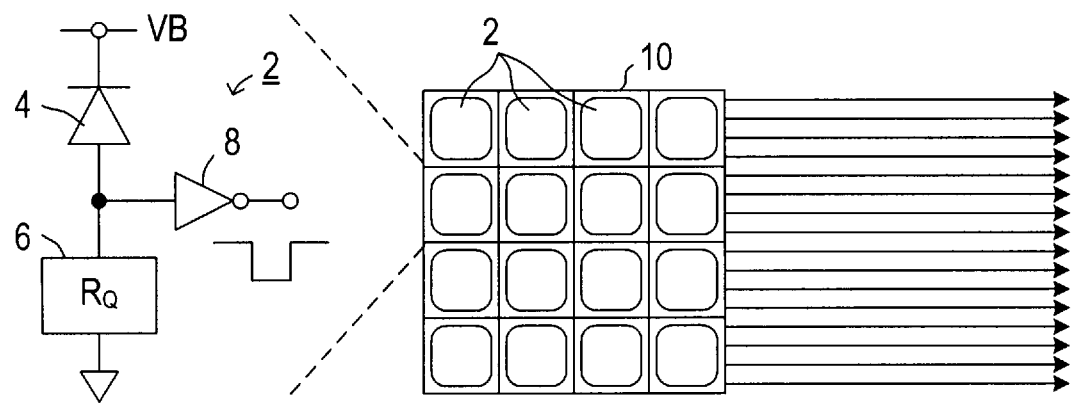
FIG. 2 is a view showing a schematic structure of light receiving parts in the light detection device according to the first exemplary embodiment shown in FIG. 1.

FIG. 2 is a view showing a schematic structure of the light receiving parts 2 in the light detection device 1A according to the first exemplary embodiment shown in FIG. 1. As shown in FIG. 2, the plurality of light receiving parts 2 are arranged in a lattice arrangement in a vertical direction and a lateral direction so as to form a light receiving array 10. Each of the light receiving parts 2 corresponds to a pixel in the light receiving array 10. When receiving incident light, each of the light receiving parts 2 generates and transmits a pulse signal which represents that the SPAD 4 respond to the incident light. Each of the light receiving parts 2 has the SPAD 4, a quench resistance 6, and a pulse signal output part 8.

In each of the light receiving parts 2 shown in FIG. 2, a cathode of the SPAD 4 is connected to a reverse bias voltage VB, and an anode of the SPAD 4 is connected to the quench resistance 6 and the pulse signal output part 8. The quench resistance 6 is connected in series to the SPAD 4.

The quench resistance 6 supplies the reverse bias voltage VB to the SPAD 4. In addition, when the SPAD 4 enters the breakdown state due to receiving of the incident light, the quench resistance 6 causes a voltage drop of the reverse bias voltage VB due to a current flowing in the SPAD 4. This prevents the SPAD 4 from performing Geiger discharging. The quench resistance 6 is composed of a resistance element having a predetermined resistance value, or composed of a metal oxide semiconductor field effect transistor (MOS FET), etc. having an on-resistance caused by a gate voltage.

The pulse signal output part 8 is connected to a connection node between the SPAD 4 and the quench resistance 6. The pulse signal output part 8 generates and transmits a pulse signal of a value of 1 when the SPAD 4 does not enter the breakdown state. The pulse signal output part 8 generates and transmits a pulse signal of a value of 0 when the SPAD 4 enters the breakdown state, and a current flows in the quench resistance 6, and a voltage, which is not less than a threshold voltage, is generated between both end terminals of the quench resistance 6. That is, the quench resistance 6 and the pulse signal output part 8 are configured to generate and transmits the pulse signal when each of the SPADs 4 responds to incident light.

Each of the light receiving parts 2 is equipped with the corresponding edge detection circuit 20A. The edge detection circuit 20A generates and transmits an edge signal when the light receiving part 2 receives incident light. As shown in FIG. 1, each of the edge detection circuits 20A has a first inverter 21, a second inverter 24 and a third inverter 26, a pair of a first clock synchronization part 22 and a second clock synchronization part 23, and a NAND gate 25. The NAND gate 25 is a logic gate. In each of the edge detection circuit 20A, the first clock synchronization part 22 is arranged at the light receiving part 2 side, and the second clock synchronization part 23 is arranged at the addition unit 40 side.

Each of the first inverter 21, the second inverter 24 and the third inverter 26 is a known logic gate capable of inverting an input signal and transmitting an inverted input signal. Each of the first clock synchronization part 22 and the second clock synchronization part 23 receives clock (CLK) signals (hereinafter, CLK signals) as periodic pulses. Each of the first clock synchronization part 22 and the second clock synchronization part 23 is a clock synchronization circuit configured to transmit the received pulse signal (i.e. the inverted pulse signal) as the input pulse signal every time it receives the CLK signal.

In each of the edge detection circuits 20A, the first clock synchronization part 22, arranged at the light receiving part 2 side, receives the inverted pulse signal transmitted from the first inverter 21. The first clock synchronization part 22 transmits a first output signal to the second clock synchronization part 23.

The second clock synchronization part 23, arranged at the addition unit 40 side, receives the first output signal transmitted from the first clock synchronization part 22. For example, each of the clock synchronization parts 22 and 23 is composed of a D flip-flop circuit, etc.

In the structure of the light detection device according to the first exemplary embodiment shown in FIG. 1, the first inverter 21 inverts a level of the pulse signal transmitted from the corresponding light receiving part 2 arranged in the light receiving array 10. The first inverter 21 transmitted the inverted pulse signal to the first clock synchronization part 22.

The first clock synchronization part 22 receives the inverted pulse signal transmitted from the first inverter 21. The first clock synchronization part 22 transmits the first output signal (i.e. the inverted pulse signal transmitted from the first inverter 21) to the NAND gate 25 and the second clock synchronization part 23 every time it receives the CLK signal.

In each of the edge detection circuits 20A, the second clock synchronization part 23 arranged at the addition unit 40 side receives the first output signal (i.e. the inverted pulse signal) transmitted from the first clock synchronization part 22 arranged at the light receiving parts 2 side.

The second clock synchronization part 23 transmits a second output signal to the second inverter 24 every time it receives the CLK signal. As shown in FIG. 1, the first clock synchronization part 22 and the second clock synchronization part 23 receive the common CLK signal. That is, because the first clock synchronization part 22 and the second clock synchronization part 23 operate in synchronization with the received common CLK signal, the second clock synchronization part 23 transmits the second output signal which is delayed from the first output signal transmitted from the first clock synchronization part 22 only by one clock signal.

Each of the edge detection circuits 20A detects, as an edge, an event when the first output signal transmitted from the first clock synchronization part 22 becomes different from the second output signal transmitted from the second clock synchronization part 23, and generates and transmits an edge signal to the addition unit 40.

The second inverter 24 inverts the second output signal transmitted from the second clock synchronization part 23 arranged at the addition unit 40 side. The second inverter 24 transmits the inverted second output signal to the NAND gate 25. The NAND gate 25 receives the inverted second output signal transmitted from the second inverter 24 and the first output signal transmitted from the first clock synchronization part 22. The NAND gate 25 performs a NAND operation on two logical values and transmits a logical output value. The edge detection circuit 20A generates and transmits the edge signal as the logical output value of the NAND operation to the addition unit 40.

The edge detection circuit 20A having the structure previously described makes it possible to detect a transition state from 1 to 0 of the first output signal transmitted from the first clock synchronization part 22 and a transition state from 1 to 0 of the second output signal transmitted from the second clock synchronization part 23. When detecting the transition state, the edge detection circuit 20A generates and transmits the edge pulse signal to the addition unit 40.

The edge detection circuit 20A having the structure previously described generates and transmits each edge pulse signal to the addition unit 40. The edge pulse signal is generated and transmitted at the timing only when the pulse signal is changed from the value of 1 to the value of 0.

In the edge detection circuit 20A, the third inverter 26 inverts the logical value as the output signal of the NAND gate 25. Each of the edge detection circuits 20A in the light detection device 1A transmits the edge pulse signal as the output signal of the third inverter 26 to the addition unit 40.

The addition unit 40 is a known adder capable of incrementing an edge pulse count value every receiving the edge pulse signal transmitted from each of the edge detection circuits 20A. The edge pulse count value represents the total number of the received edge pulse signals transmitted from the edge detection circuits 20A. The addition unit 40 transmits the edge pulse count value to the arithmetic unit 50.

That is, the edge detection circuits 20A and the addition unit 40 are configured to count the number of edges during a period from a previously received CLK signal to a currently received CLK signal every time it receives the CLK signal transmitted at a predetermined period.

This edge represents the transition state from a first state to a second state. In the first state, the SPAD 4 does not detect incident light and the corresponding light receiving part 2 does not transmit the pulse signal. On the other hand, in the second state, the SPAD 4 detects incident light and the corresponding light receiving part 2 transmits the pulse signal.

The number of the edges received during the period from the previously received CLK signal to the currently received CLK signal is referred to as an edge value.

The addition unit 40 detects, as a level value, the number of the light receiving parts 2 which are currently transmitting, to the corresponding edge detection circuits 20A, the pulse signals having the value of zero every time is receives the CLK signal. In other words, the level value represents the number of the light receiving parts 2 which are currently transmitting the pulse signals having the value of zero to the corresponding edge detection circuits 20A. Because the level value represents the number of the SPADs 4 in the light receiving parts 2 which currently respond to incident light, the level value represents a strength value of the incident light.

Each of the light receiving parts 2 having the structure previously described generates and transmits the pulse signal with the frequency which corresponds the amount of incident light, i.e. the amount of surrounding lights. When receiving strong sun light, the number of the pulse signals transmitted from the light receiving parts 2 remarkably increases. In this case, the total number of the pulse signals transmitted from the light receiving parts 2 per unit time remarkably increases, i.e. a pulse rate significantly increases.

The arithmetic unit 50 has a microcomputer system composed of a central processing unit (CPU) 51, a memory unit 52 having a read only memory (ROM), a random access memory (RAM), a flash memory, etc. The arithmetic unit 50 has various functions which are realized by performing programs stored in the memory unit 52 which corresponds to a non-transition entities recording medium. The memory unit 52, i.e. the non-transition entities recording medium does not use magnetic waves.

It is acceptable for the arithmetic unit 50 to use one or more microcomputer systems. The CPU 51 executes the programs stored in the memory unit 52 so as to realize various functions of the light detection device according to the first exemplary embodiment.

[Process and Action]

As shown in FIG. 1, the arithmetic unit 50 executes the programs stored in the memory unit 52 so as to provide a peak detection part 56 and a timing correction part 57. It is acceptable for the light detection device to use one or more hardware devices such as digital circuits including a plurality of logical circuits or analogue circuits, or a combination of them so as to realize the functions of the peak detection part 56 and the timing correction part 57.

Figure 3:
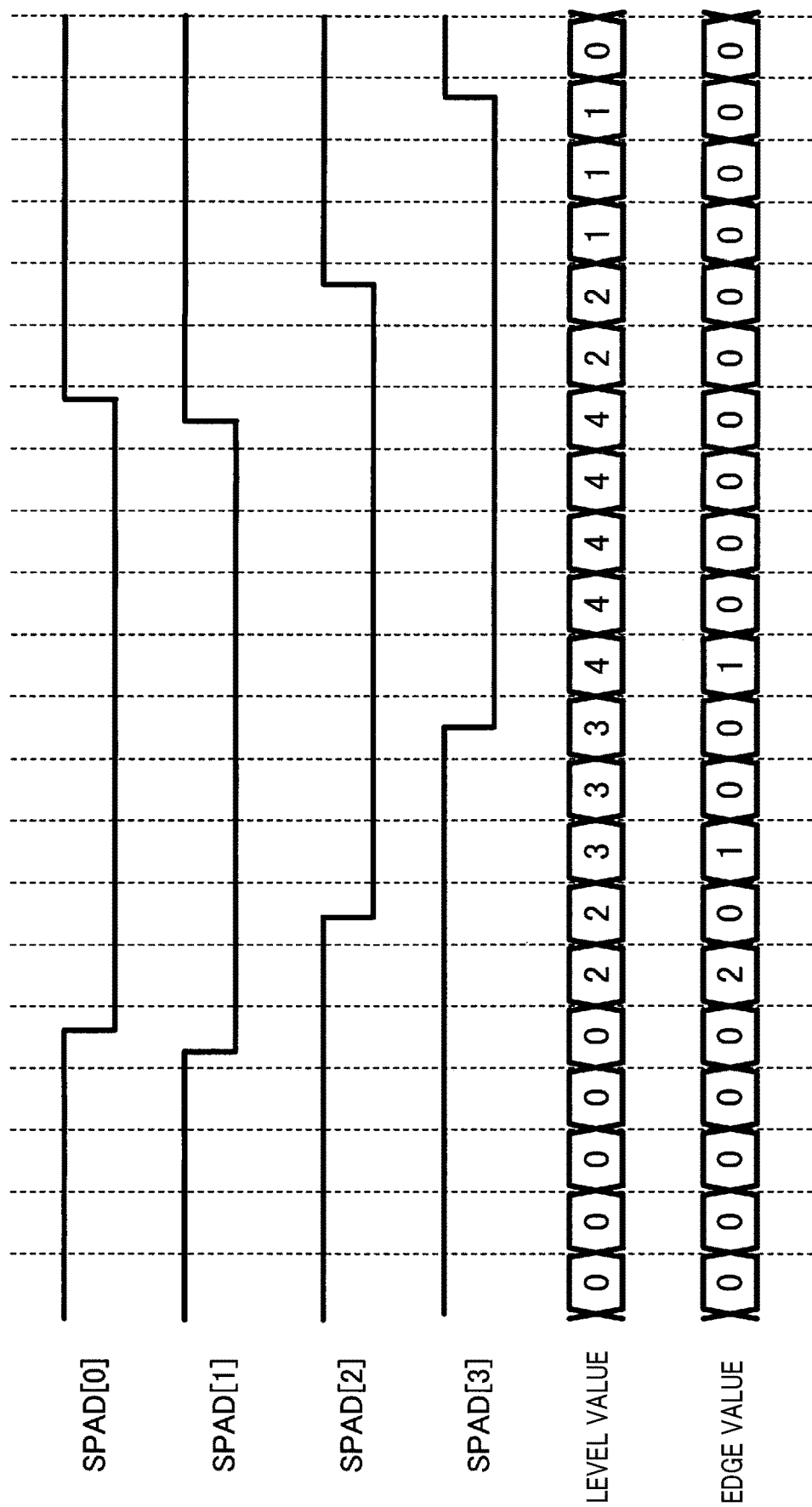
FIG. 3 is a view showing an operation example of the light detection device according to the first exemplary embodiment shown in FIG. 1.

FIG. 3 is a view showing an operation example of the light detection device according to the first exemplary embodiment shown in FIG. 1. In the operation example of the light detection device 1A shown in FIG. 3, each of the light receiving parts 2 has the four SPADs 4, i.e. the SPAD [0], the SPAD [1], the SPAD [2] and the SPAD [3]. The light receiving parts 2, i.e. the edge detection circuit 20A transmit the maximum level value at the timing when all of the SPADs 4 receive and detect the incident light simultaneously. As shown in FIG. 3, the light receiving parts 2 transmits pulse signals and the edge detection circuit 20A provides the maximum level value at the timing when the SPAD [3] responds to the incident light, i.e. at the timing when all of the SPADs 4 detect the incident light simultaneously. In FIG. 3, FIG. 6, FIG. 10 and FIG. 12 use the SPAD [N], where N is zero or a positive number such as 0, 1, 2, 3 . . . .

On the other hand, the addition unit 40 increments the edge value at the timing only when the value of the pulse signal transmitted from the SPAD 4, i.e. the light receiving part 2 is changed from the value of 1 to the value of zero. Accordingly, the timing when the level value has the maximum level value is different from the timing when the edge value has the maximum edge value. In the case shown in FIG. 3, the addition unit 40 generates the maximum edge value of 2 at the timing when the SPAD [0] and the SPAD [1] transmit the pulse signal having the value of zero.

Figure 4:
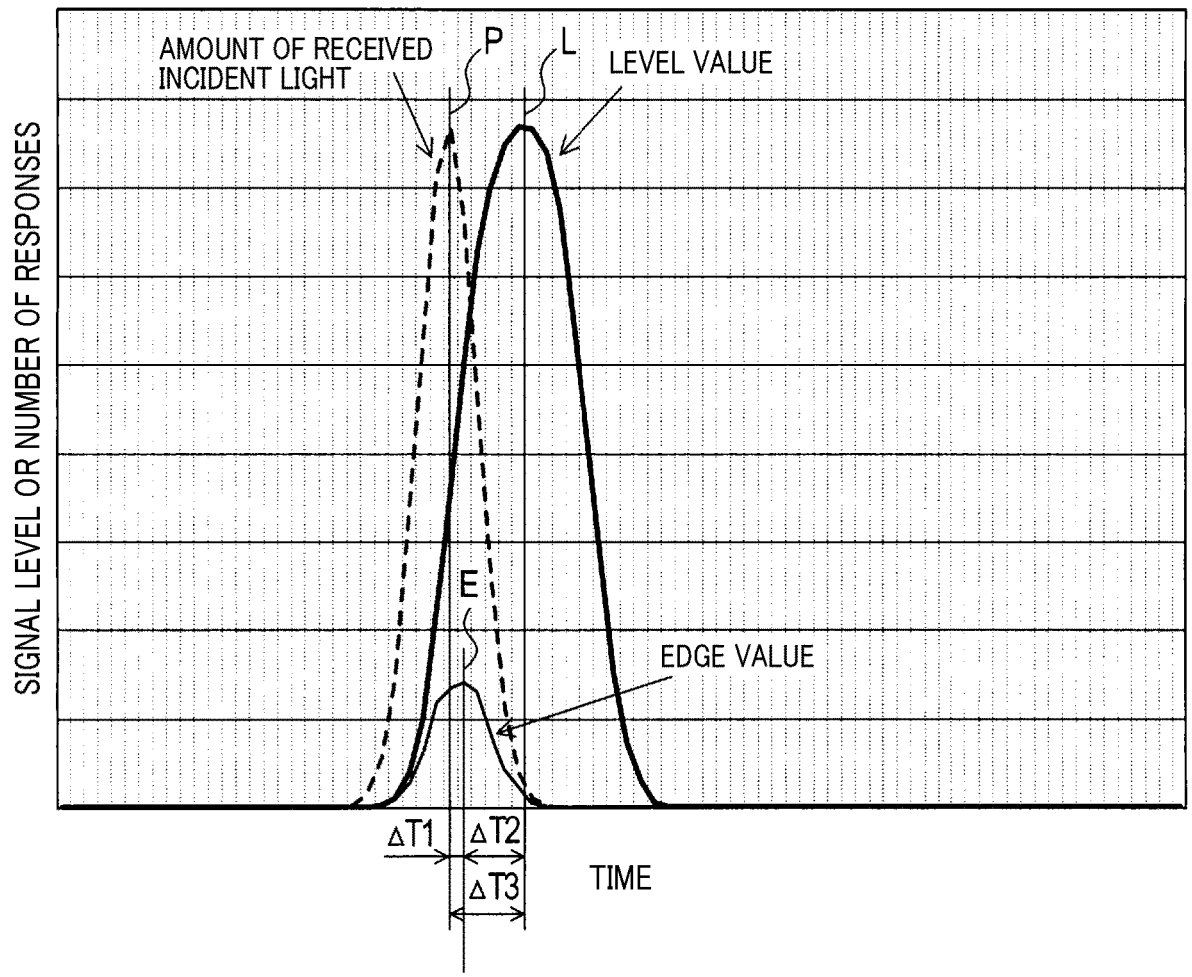
FIG. 4 is a graph showing a relationship in time change between an amount of incident light (i.e. incident photons), an edge value of the incident light, and a level value of the incident light in the light detection device according to the first exemplary embodiment.

FIG. 4 is a graph showing a relationship in time change between an amount of received incident light, the edge value of the incident light, and the level value of the incident light in the light detection device according to the first exemplary embodiment.

For example, the light detection device according to the first exemplary embodiment receives incident light as shown in FIG. 4.

As shown in FIG. 4, when the amount of the received incident light increases, the level value and the edge value increase, and the level value is greater than the edge value. As clearly shown in FIG. 4, a time difference ΔT1 is smaller than a time difference ΔT3 by a time difference ΔT2, where the time difference ΔT1 represents a difference between a true timing P when the amount of the received incident light has a maximum value and a timing E when the edge value has a maximum value, and the time difference ΔT3 represents a difference between the true timing P and a timing L when the level value has a maximum value. The time difference ΔT2 represents a difference between the timing E and the timing L.

The true timing P is a true timing (or a theoretical timing) when the amount of incident light received by the light detection device 1A becomes a maximum value, i.e. a peak value). Because the light detection device 1A cannot correctly detect the true timing P, the light detection device 1A uses, as the true timing P, a predetermined timing which has been obtained on the basis of experimental results.

For this reason, in order to detect the correct timing when the light receiving parts 2 receive incident light, it is preferable for the light detection device 1A to use the timing E at which the edge value has the maximum value, instead of using the timing L at which the level value has the maximum value.

The arithmetic unit 50 uses the timing E at which the edge value has the maximum value and performs the processes so as to correctly detect the timing when the light receiving parts 2 receive incident light with high accuracy.

That is, the peak detection part 56 detects the timing E when the light detection device 1A detects the edge, and further detects the timing when the light detection device 1A detects incident light in accordance with the number of edges every timing E.

Specifically, the peak detection part 56 detects the timing E when the number of edges becomes a peak value. It is acceptable to use the timing E as the timing when the light detection device 1A detects the incident light. However, in order to detect the timing when the light detection device 1A has just received the incident light with high accuracy, the timing correction part 57 corrects the detected timing E when the number of the edges becomes the maximum value.

Specifically, the timing correction part 57 corrects the timing E by a predetermined correction time which has been determined as the time difference ΔT1 when the amount of incident light becomes a peak value. The timing correction part 57 uses the corrected timing E as the timing when the light receiving parts 2 has received the incident light.

Effects

A description will now be given of the effects of the light detection device 1A according to the first exemplary embodiment.

(1a) The light detection device 1A according to the first exemplary embodiment has the plurality of light receiving parts 2, the plurality of edge detection circuits 20A and the addition unit 40. As shown in FIG. 2, each of the light receiving parts 2 has the SPAD 4, the quench resistance 6, the pulse output part 8, etc.

The quench resistances 6 and the pulse signal output parts 8 in the light receiving parts 2 are configured to generate and transmit the pulse signals to the edge detection circuits 20A every time the SPADs 4 respond to the incident light.

The edge detection circuits 20A and the addition units 40 are configured to detect and count the total number of the edges every time it receives the CLK signals transmitted at a predetermined period during the period from the previously received CLK signal and the currently received CLK signal. The edges, i.e. the edge signal, represent the transition state from the first state in which the SPAD 4 does not receive any incident light to the second state in which the SPAD 4 receives incident light.

The light detection device 1A having the structure previously described according to the first exemplary embodiment detects and increments the number of the edges every time it receives the CLK signal. Accordingly, when comparing with a comparative example which counts the response number, i.e. the number of times for the SPADs 4 to receive incident light, the light detection device 1A according to the first exemplary embodiment makes it possible to avoid influence of the time period when the SPADs 4 responds to incident light. It is possible for the light detection device 1A according to the first exemplary embodiment to estimate the timing when the light detection device 1A receives and detects the incident light with high accuracy.

(1b) FIG. 4 shows the example having a single peak of the amount of incident light.

Figure 5:
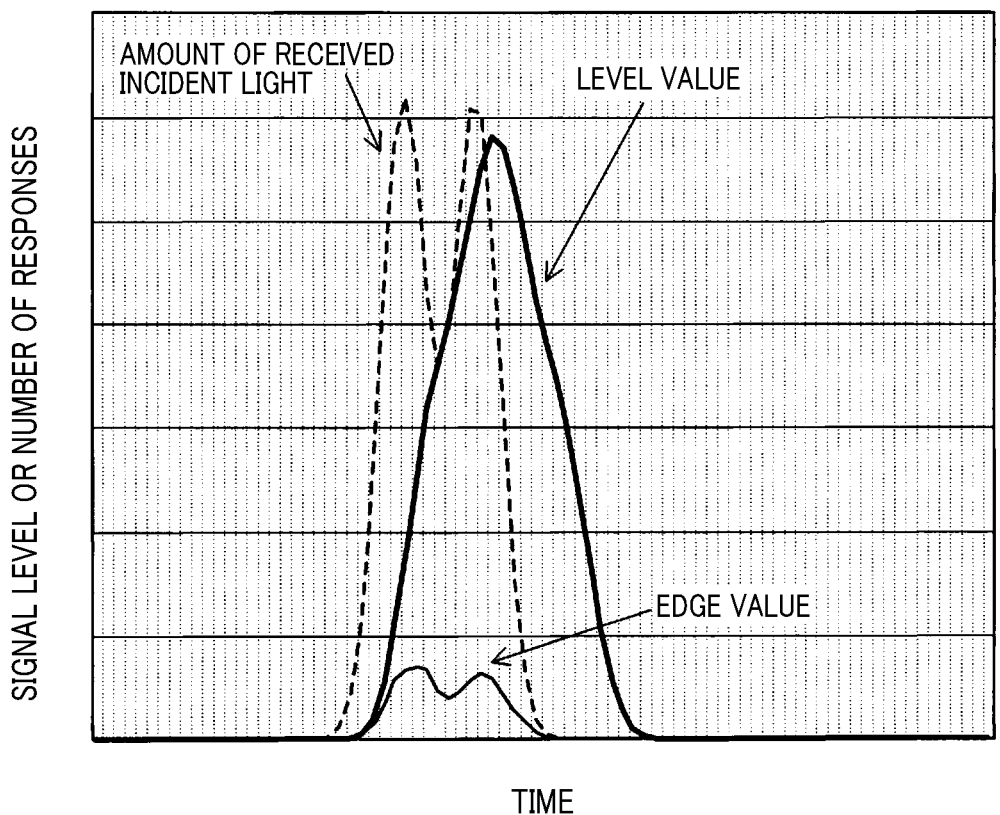
FIG. 5 is a graph showing another relationship in time change between the amount of incident light, the edge value of the incident light, and the level value of the incident light in the light detection device according to the first exemplary embodiment.

FIG. 5 is a graph showing another relationship in time change between the amount of the received incident light, the edge value of the incident light, and the level value of the incident light in the light detection device according to the first exemplary embodiment. The case shown in FIG. 5 in which light, i.e. photons, is reflected by a plurality of objects has not less than two peaks of the amount of incident light reflected by the plurality of objects. However, there is a possible case in which only a single peak is detected even through there are not less than two peaks of the amount of received incident light.

Figure 6:
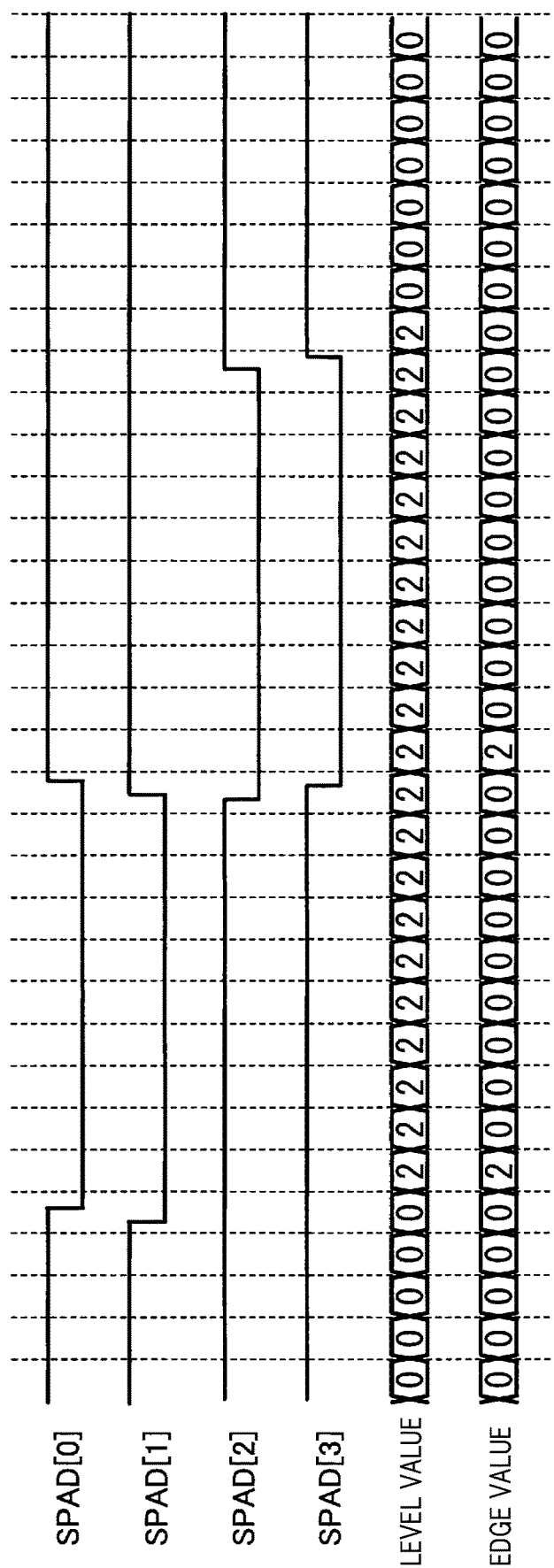
FIG. 6 is a view showing another operation example of the light detection device according to the first exemplary embodiment shown in FIG. 1.

FIG. 6 is a view showing another operation example of the light detection device 1A according to the first exemplary embodiment shown in FIG. 1. As shown in FIG. 6, when the SPAD [2] and the SPAD [3] start the response to the incident light at the timing when the SPAD [0] and the SPAD [1] finish the response to the incident light, there is a possible case in which the level value does not follow the change of the amount of the received incident light even if the amount of the received incident light is changed.

As shown in FIG. 5 and FIG. 6, the edge value is changed due to the amount of received incident light even if the amount of the received incident light has not less than two peaks. Accordingly, the light detection device 1A according to the first exemplary embodiment can correctly estimate the timing when the light receiving parts 2 receive and detect the incident light eve if there are not less than two peaks of the amount of the received incident light.

(1c) In the structure of the light detection device 1A according to the first exemplary embodiment previously described, the edge detection circuits 20A is formed as the clock synchronous circuit capable of detecting the occurrence of edges. It is therefore possible for the light detection device 1A to have the function of detecting the occurrence of edges with a simple structure by using the clock synchronous circuits as hardware devices when compared with a structure having the same function realized by executing software programs.

(1d) In the structure of the light detection device 1A according to the first exemplary embodiment previously described, the arithmetic unit 50 is configured to recognize and determine the photo detection timing of the light detection device 1A on the basis of the timing when the light detection device 1A detects the occurrence of edges and the number of edges every timing when the light detection device 1A detects incident light.

In the light detection device 1A having the structure previously described, it is possible to correctly detect the timing when the light detection device 1A detects incident light on the basis of the calculation results of the arithmetic unit 50.

(1e) In the structure of the light detection device 1A according to the first exemplary embodiment previously described, the arithmetic unit 50 detects the timing E when the number of edges has the maximum value, i.e. the peak value. The arithmetic unit 50 is configured to correct the timing E by a time length as the time difference ΔT1 between the timing E and the timing P when the amount of received incident light has the peak value. The arithmetic unit 50 uses the corrected timing E as the timing when the light detection device 1A detects the incident light.

It is possible for the light detection device 1A having the structure previously described to detect the timing when the light detection device 1A detects incident light with high accuracy by considering the time difference between the timing E and the timing P.

Second Exemplary Embodiment

A description will be given of a light detection device 1B according to the second exemplary embodiment with reference to FIG. 7. Because the light detection device 1B according to the second exemplary embodiment has the structure which basically corresponds to the structure of the light detection device 1A according to the first exemplary embodiment, the same reference numbers and characters represent the same components. The explanation of the same component is omitted for brevity.

In the structure of the light detection device 1A according to the first exemplary embodiment previously described, each of edge detection circuits 20A has the first clock synchronization part 22 and the second clock synchronization part 23.

Figure 7:
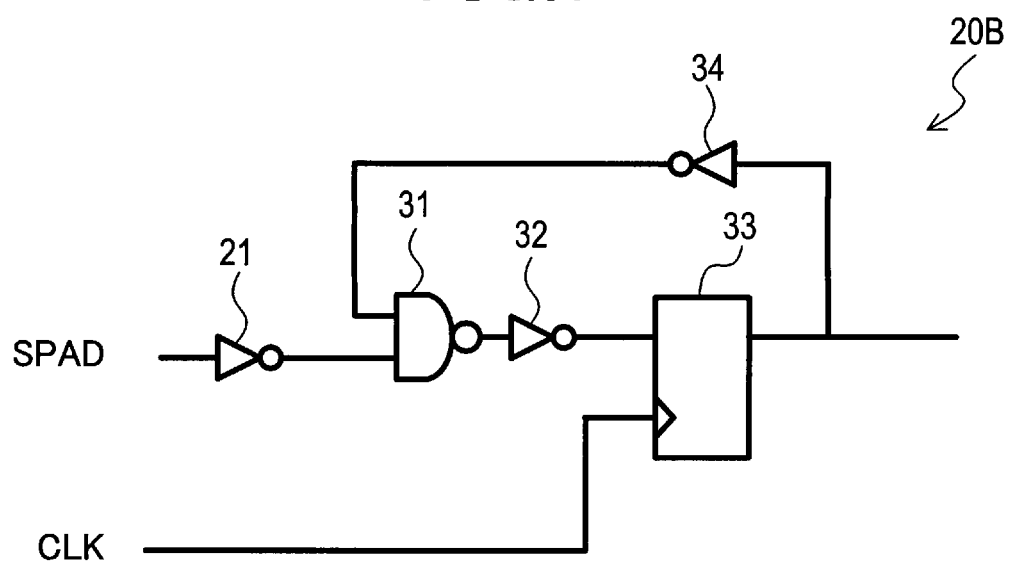
FIG. 7 is a block diagram showing a structure of an edge detection circuit used in the light detection device according to a second exemplary embodiment of the present invention.

On the other hand, the light detection device 1B according to the second exemplary embodiment has the structure shown in FIG. 7 in which the edge detection circuits 20B are used instead of using the edge detection circuits 20A shown in FIG. 1.

In the structure of the light detection device 1B according to the second exemplary embodiment, each of edge detection circuits 20B has only one clock synchronization part 33 instead of two clock synchronization units.

(Structure)

The light detection device 1B according to the second exemplary embodiment has the edge detection circuits 20B. Each of the edge detection circuits 20B has the same structure, but different from the structure of the edge detection circuit 20A shown in FIG. 1. FIG. 7 shows one of the edge detection circuits 20B.

As shown in FIG. 7, the edge detection circuits 20B has the first inverter 21, a NAND gate 31, an inverter 32, and the clock synchronization part 33 which are connected in series. The clock synchronization part 33 transmits the edge pulse signal as the output signal of the edge detection circuits 20B. The edge detection circuits 20B further transmits the output signal to an inverter 34. The inverter 34 transmits its output to the NAND gate 31.

As shown in FIG. 7, the NAND gate 31 receives the output signal transmitted from the first inverter 21 and the output signal transmitted from the inverter 34. The NAND gate 31 generates a negative AND operation (NAND operation) and transmits the operation result to the inverter 32. The clock synchronization part 33 shown in FIG. 7 has the same structure of each of the first clock synchronization part 22 and the clock synchronization part 23 shown in FIG. 1.

In the structure of the light detection device 1B according to the second exemplary embodiment, the NAND gate 31 transmits the output signal having the value of zero only when the pulse signal transmitted from each of the light receiving parts 2 is changed from the value of 1 to the value of zero.

(Effects)

In addition to the effect (1a) of the light detection device 1A according to the first exemplary embodiment previously described, the light detection device 1B according to the second exemplary embodiment has the following effect (2a).

(2a) Because the light detection device 1B has the structure in which each edge detection circuit 20B has one clock synchronization part 33, instead of two clock synchronization parts, this structure makes it possible to reduce the circuit size.

Third Exemplary Embodiment

A description will be given of a light detection device 1C according to the third exemplary embodiment with reference to FIG. 8.

Figure 8:
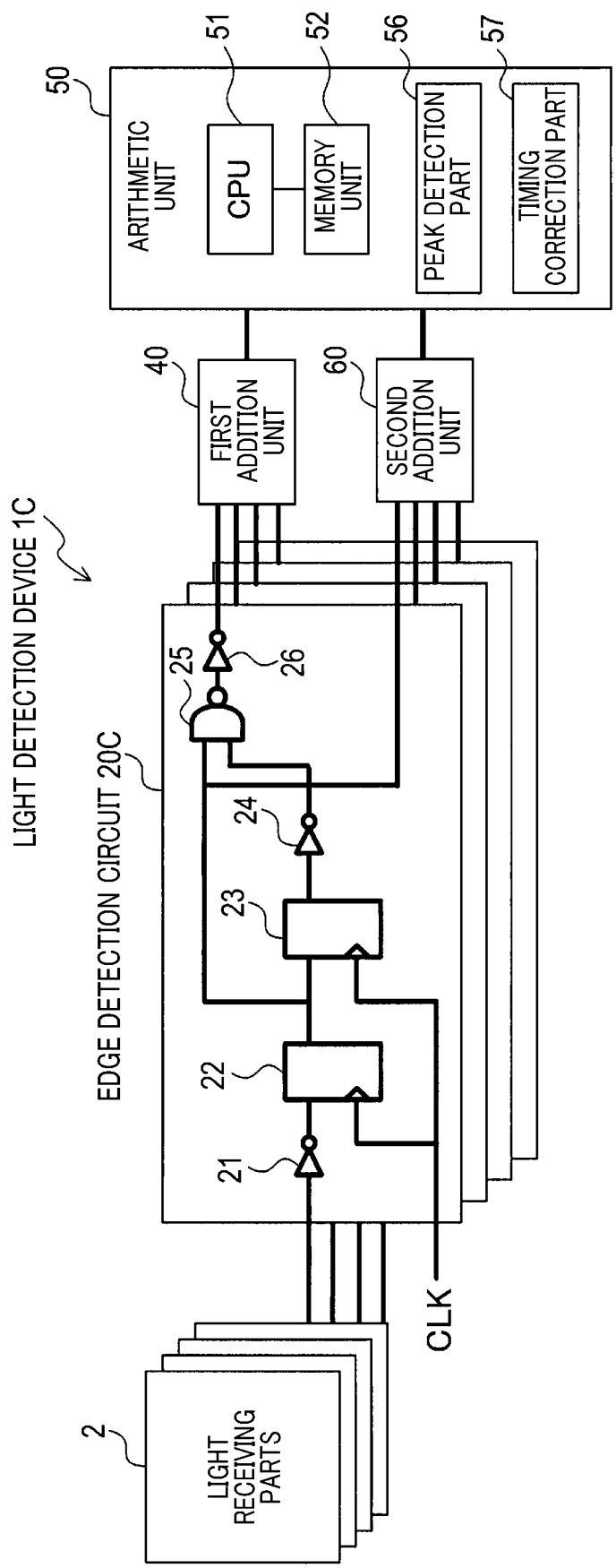
FIG. 8 is a block diagram showing a structure of a light detection device according to a third exemplary embodiment of the present invention.

FIG. 8 is a block diagram showing the structure of the light detection device 1C according to the third exemplary embodiment of the present invention. As shown in FIG. 8, the light detection device 1C according to the third exemplary embodiment has the structure which basically corresponds to the structure of the light detection device 1A shown in FIG. 1 according to the first exemplary embodiment. The same reference numbers and characters represent the same components. The explanation of the same component is omitted for brevity.

The light detection device 1C according to the third exemplary embodiment has the structure shown in FIG. 8 in which a second addition circuit 60 is further added and the edge detection circuits 20C are used instead of the edge detection circuits 20A shown in FIG. 1. Each of the edge detection circuits 20C has the same structure.

(Structure)

The edge detection circuit 20C in the light detection device 1C according to the third exemplary embodiment has the structure which basically corresponds to the structure of the edge detection circuit 20A in the light detection device 1A according to the first exemplary embodiment.

In the edge detection circuit 20C, the second addition unit 60 receives the output signal transmitted from the first clock synchronization part 22. The addition unit 40 does not receive the output signal transmitted from the first clock synchronization part 22.

The second addition unit 60 receives the output signal transmitted from the first clock synchronization part 22, which represents whether the edge detection circuit 20C receives the pulse signal transmitted from the corresponding light receiving part 2. The arithmetic unit 50 receives the output signal transmitted from the second addition unit 60, and detects the number of responses of incident light, i.e. the number of times for the photo receiving parts 2 to receive incident light on the basis of the received output signal transmitted from the second addition unit 60 every time the edge detection circuit 20C receives the CLK signal.

(Processes)

The arithmetic unit 50 performs the calculation process on the basis of the number of responses of incident light indicated by the output signal transmitted from the second addition unit 60 in addition to the information regarding the number of edges supplied from the addition unit 40. Specifically, the arithmetic unit 50 performs the process to detect the timing when the photo receiving part 2 receives incident light on the basis of the number of edges indicated by the output signal transmitted from the addition unit 40 so as to determine the timing when the photo receiving part 2 receives incident light. In addition, the arithmetic unit 50 performs the process to detect the number of responses indicated by the output signal transmitted from the second addition unit 60 so as to detect the strength of received incident light, i.e. received incident light.

As shown in FIG. 4, the strength of incident light, i.e. incident light calculated on the basis of the level value becomes greater than that on the basis of the edge value. Accordingly, it is possible to use the level value so as to obtain the strength of incident light, i.e. incident light with high accuracy.

(Effects)

The light detection device 1C according to the third exemplary embodiment has the following effects (3a) to (3d) in addition to the effect (1a) of the light detection device 1A according to the first exemplary embodiment previously described.

(3a) In the structure of the light detection device 1C according to the third exemplary embodiment previously described, the addition unit 40 and each of the edge detection circuits 20C are configured to detect and recognize the number of responses every receiving the CLK signal transmitted at the predetermined period.

The light detection device 1C having the structure previously described supplies, to the arithmetic unit 50, the information regarding the number of responses and the number of edges. Accordingly, it is possible for the arithmetic unit 50 to detect the number of responses in addition to the number of edges.

(3b) In the structure of the light detection device 1C according to the third exemplary embodiment previously described, each of the edge detection circuits 20C is formed as the clock synchronization part.

It is accordingly possible for the light detection device 1C to have the function of detecting the pulse signals with a simple structure by using the clock synchronous circuits as hardware devices when compared with a structure having the same function realized by executing software programs.

(3c) In the structure of the light detection device 1C according to the third exemplary embodiment previously described, the edge detection circuit 20C has the first clock synchronization part 22 as the clock synchronization part which is commonly used for detecting the number of edges and the number of pulse signals.

Accordingly, because one clock synchronization part in the light detection device 1C performs many functions such as the detection of the number of edges and the number of responses, it is possible to form the light detection device 1C with a simple structure.

(3d) In the structure of the light detection device 1C according to the third exemplary embodiment previously described, the arithmetic unit 50 is configured to calculate the strength of incident light, i.e. incident light on the basis of the number of responses indicated by the output signal transmitted from the second addition unit 60. The light detection device 1C having the structure previously described makes it possible to detect the strength of incident light at an optional timing on the basis of the number of responses indicated by the output signal transmitted from the second addition unit 60.

Fourth Exemplary Embodiment

A description will be given of a light detection device 1D according to the fourth exemplary embodiment with reference to FIG. 9.

Figure 9:
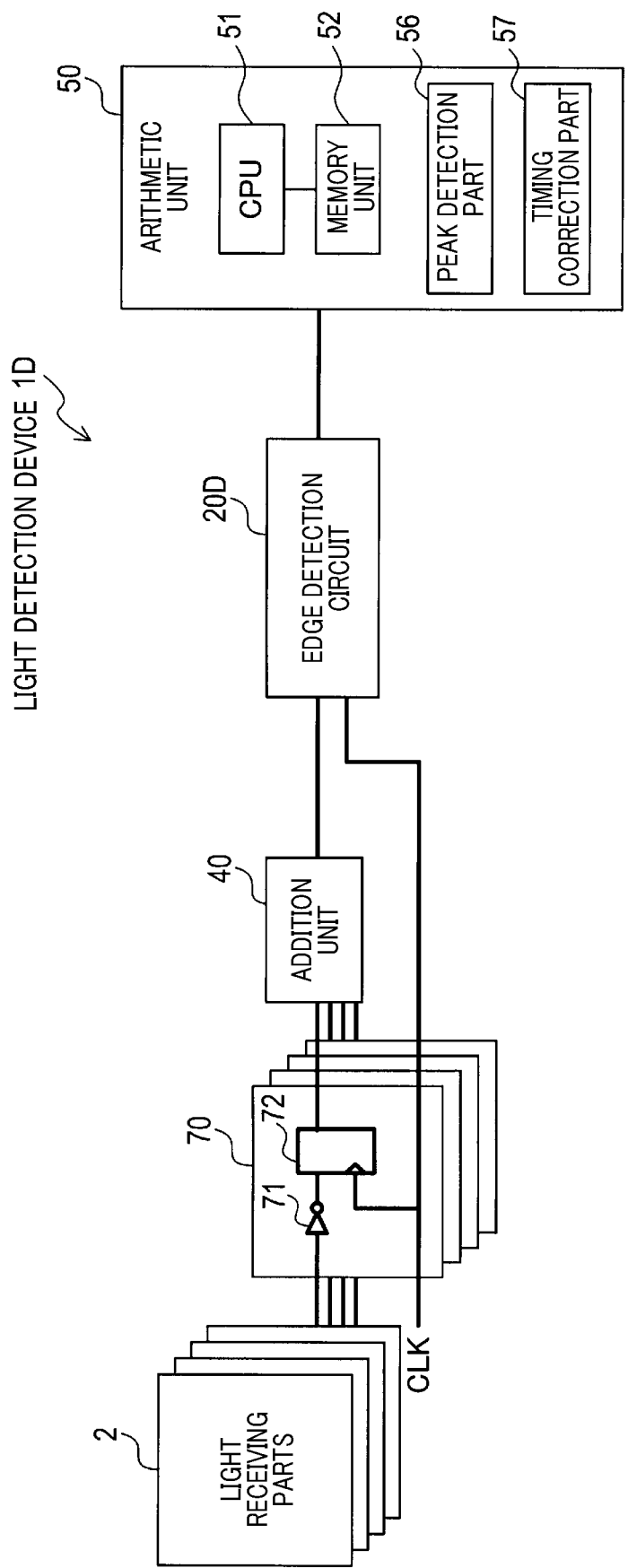
FIG. 9 is a block diagram showing a structure of a light detection device according to a fourth exemplary embodiment of the present invention.

FIG. 9 is a block diagram showing the structure of the light detection device 1D according to the fourth exemplary embodiment of the present invention.

As previously described, the light detection device 1C according to the third exemplary embodiment uses both the addition unit 40 and the second addition unit 60, as shown in FIG. 8.

On the other hand, as shown in FIG. 9, the light detection device 1D according to the fourth exemplary embodiment uses the addition unit 40, does not use the second addition unit 60 shown in FIG. 8.

(Structure)

As shown in FIG. 9, the light detection device 1D according to the fourth exemplary embodiment has a plurality of level detection units 70, and further has an edge detection circuit 20D instead of using the plurality of edge detection circuits 20A shown in FIG. 1.

In the structure of the light detection device 1D according to the fourth exemplary embodiment, the level detection units 70 and the light receiving parts 2 are arranged in one to one correspondence.

The level detection unit 70 has an inverter 71 and a clock synchronization part 72. The inverter 71 receives the pulse signal transmitted from the corresponding light receiving part 2. The clock synchronization part 72 receives the output signal transmitted from the inverter 71. The clock synchronization part 72 transmits the output signal as the output signal of the level detection unit 70. The clock synchronization part 72 has the same structure of each of the first clock synchronization part 22 and the second clock synchronization part 23.

The plurality of level detection units 70 transmit the output signals thereof to the addition unit 40, and the edge detection circuit 20D. The edge detection circuit 20D has the same structure of the edge detection circuit 20A from which the first inverter 21 is eliminated.

(First Operation)

Figure 10:
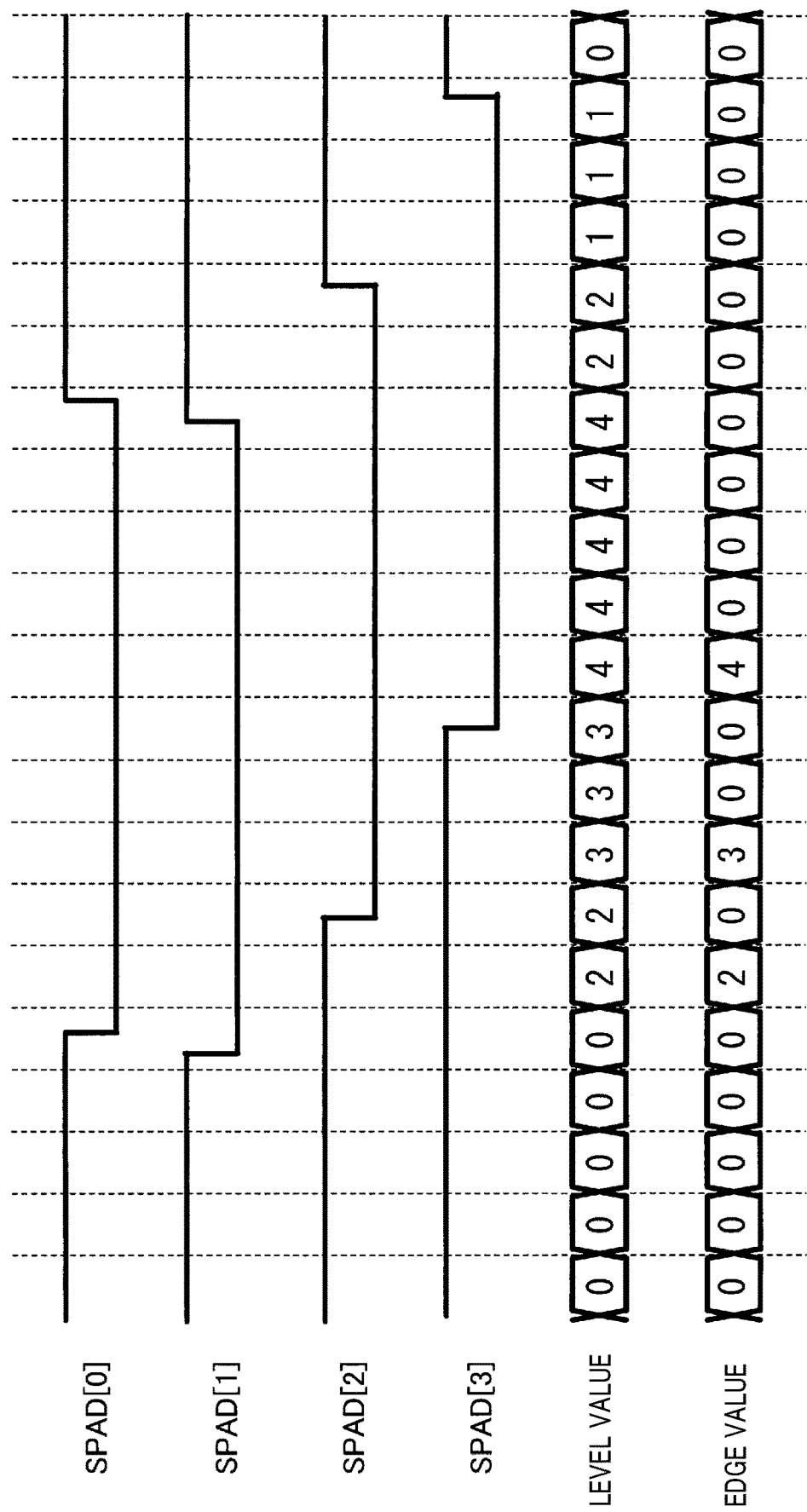
FIG. 10 is a view showing an operation example of the light detection device according to the fourth exemplary embodiment shown in FIG. 9.

FIG. 10 is a view showing an operation example of the light detection device 1D using the four SPAD 4 according to the fourth exemplary embodiment shown in FIG. 9.

The light detection device 1D detects, as the edge, the timing when the level value is changed, and transmits the output signal regarding the level value.

In the operation example shown in FIG. 10, the light detection device 1D detects the edge value of 2 at the timing when the level value is changed from 0 to 2. Further, the light detection device 1D detects the edge value of 3 at the timing when the level value is changed from 2 to 3. When the level value is reduced, the light detection device 1D detects the edge value of 0.

(Second Operation)

As previously described, the timing L when the level value has a maximum level value is delayed by the time difference ΔT2 from the timing E when the edge value has a maximum edge value (see FIG. 4, for example), and it is acceptable to use the level value, corresponding to the edge value, at the timing which is delayed from the timing when the edge value is detected.

It is preferable for the arithmetic unit 50 to detect, as the edge value, the level value at the timing which has been corrected by the timing correction part 57 on the basis of a time difference between the timing when the number of responses has a peak response value and the timing when the number of edges gas a peak edge value. That is, the arithmetic unit 50 performs a software program so as to realize the function of the timing correction part 57.

Figure 11:
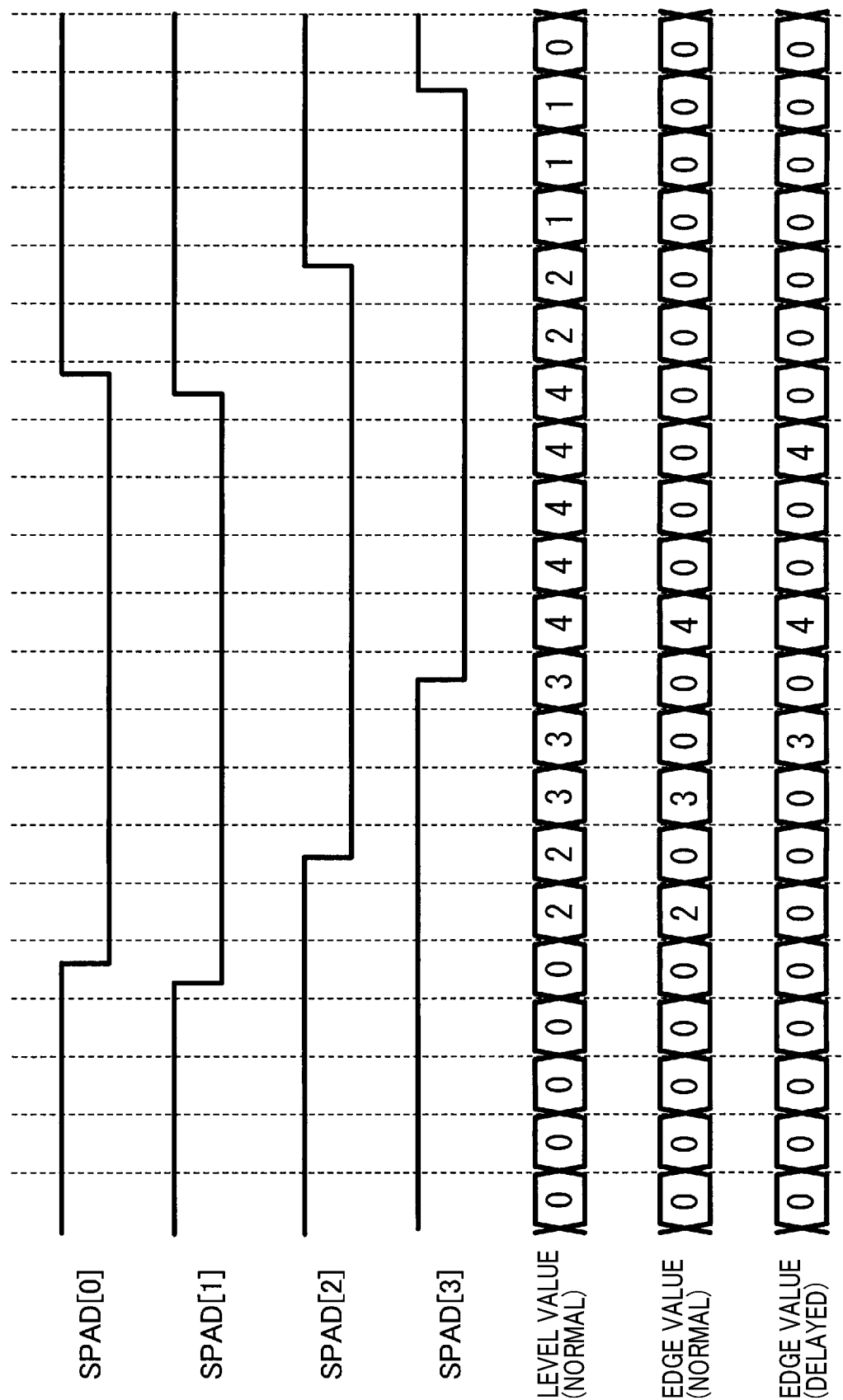
FIG. 11 is a view showing another operation example of the light detection device according to the fourth exemplary embodiment shown in FIG. 9.

FIG. 11 is a view showing another operation example of the light detection device using the four SPADs 4 according to the fourth exemplary embodiment shown in FIG. 9

In the operation example shown in FIG. 11, the arithmetic unit 50 detects and uses the level value at the timing which is delayed from the timing when the edge is detected by three CLK signals (Effects)

The light detection device 1D according to the fourth exemplary embodiment has the following effects (4a) and (4b) in addition to the effect (1a) of the light detection device 1A according to the first exemplary embodiment previously described.

(4a) In the structure of the light detection device 1D according to the fourth exemplary embodiment previously described, because the level detection unit 70 and the edge detection circuit 20D are connected in series, it is possible to detect the level value at the timing when the level value is changed. That is, it is possible to detect the edge value on the basis of the increased number of the level value, and to detect both the edge value and the level value on the basis of the type of parameter data.

(4b) In the structure of the light detection device 1D according to the fourth exemplary embodiment previously described, it is possible to detect, as the strength of light or incident light corresponding to the number of edges, the number of responses detected during the period which is delayed by the difference between the peak response value the peak edge value.

Because the light detection device 1D having the structure previously described can correctly use the characteristics of the SPADs 4 in which the peak response value is delayed from the peak edge value, it is possible to detect the strength of incident light with high accuracy on the basis of the number of responses obtained at the timing which is delayed by a difference between the peak response value and the peak edge value.

Fifth Exemplary Embodiment

A description will be given of a light detection device 1E according to the fifth exemplary embodiment with reference to FIG. 12.

Figure 12:
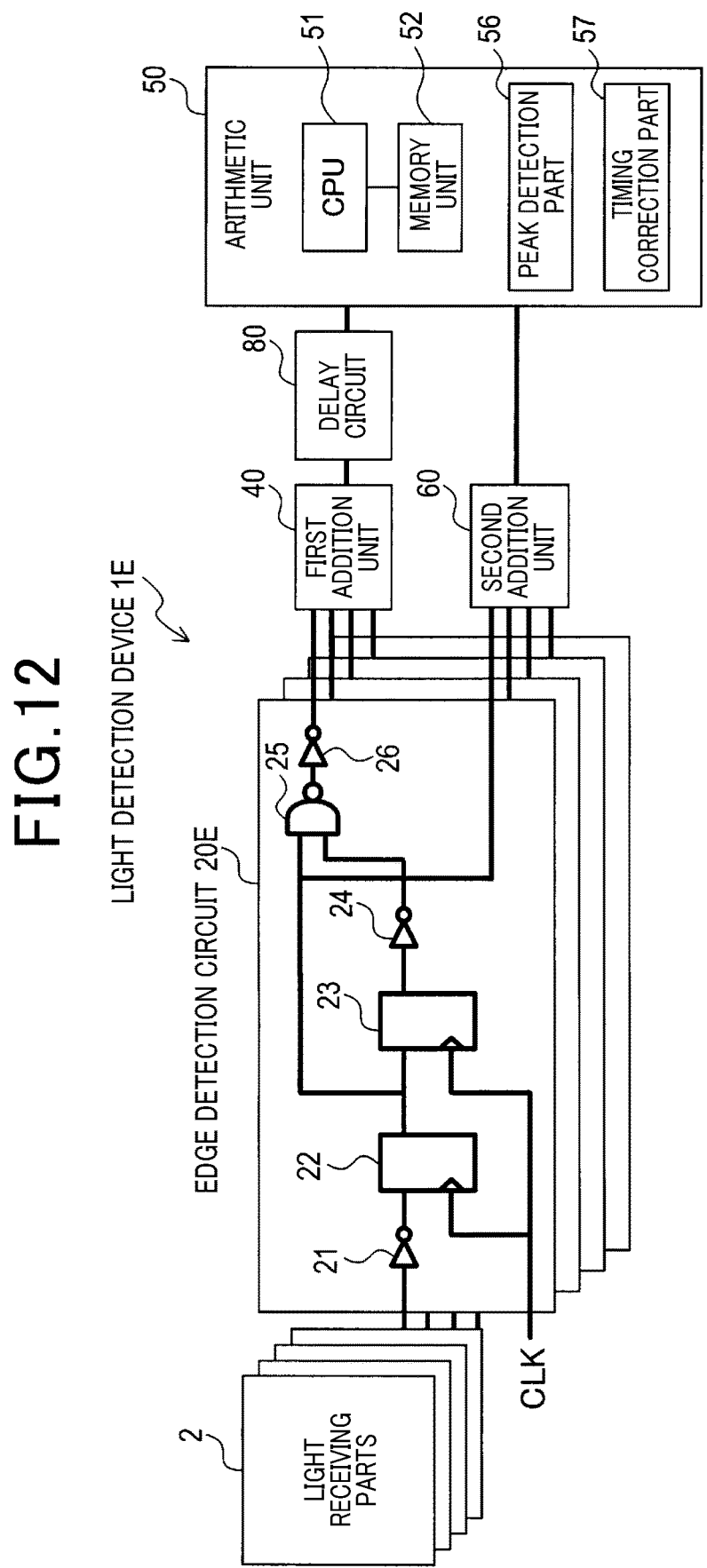
FIG. 12 is a block diagram showing a structure of a light detection device according to a fifth exemplary embodiment of the present invention.

FIG. 12 is a block diagram showing the structure of the light detection device 1E according to the fifth exemplary embodiment of the present invention.

As previously described, the light detection device 1D according to the fourth exemplary embodiment executes the software programs so as to realize the function to detect the strength of incident light or incident light corresponding to the number of edges on the basis of the number of responses obtained at the timing which is delayed by the time difference between the peak response value and the peak edge value.

On the other hand, as shown in FIG. 12, it is possible for the light detection device 1E according to the fifth exemplary embodiment uses, as the delay circuit 80, a hardware circuit having the function which is equal to the function of the software programs executed by the light detection device 1D according to the fourth exemplary embodiment.

As shown in FIG. 12, the light detection device 1E according to the fifth exemplary embodiment has a delay circuit 80 in addition to the structure of the light detection device 1D according to the fourth exemplary embodiment.

As shown in FIG. 12, the delay circuit 80 receives the output signal transmitted from the addition unit 40, and delays this received output signal by a predetermined time, and transmits the delayed output signal to the arithmetic unit 50.

Each of the edge detection circuits 20E in the light detection device 1E according to the fifth exemplary embodiment shown in FIG. 12 has the same structure of each of the edge detection circuits 20C in the light detection device 1C according to the third exemplary embodiment shown in FIG. 8.

(Structure and Effects)

The delay circuit 80 receives the addition result which represents the number of edges, and transmits the output signal which represents the number of edges to the arithmetic unit 50 at a timing which is delayed by the time difference between the peak response value and the peak edge value.

The arithmetic unit 50 receives the information regarding the number of edges and the number of responses which correctly correspond to each other. In other words, it is possible for the arithmetic unit 50 to receive the output signal representing the number of edges in which the number of edges has been corrected by the time difference between the peak response value and the peak edge value.

It is possible for the light detection device 1E to have a plurality of delay stages which depend on the number of CLK signals to be delayed.

Sixth Exemplary Embodiment

A description will be given of a light detection device 1F according to the sixth exemplary embodiment with reference to FIG. 1, FIG. 13, FIG. 14 and FIG. 15.

As previously described, the light detection device 1A according to the first exemplary embodiment determines, as the timing when the light receiving parts 2 receives the incident light, the correction time E which has been predetermined as the time difference ΔT1 between the timing P when the amount of received incident light has a peak value and the timing E when the number of edges is a peak edge value.

On the other hand, the light detection device 1F according to the sixth exemplary embodiment calculates the correction time on the basis of the state of the light receiving environment, which corresponds to the time difference ΔT1.

A description will now be given of the structure in which the timing correction part 57 calculates the correction time by using a correction map. However, the concept of the present invention is not limited by this structure. For example, it is acceptable for the timing correction part 57 to calculate the correction time on the basis of a formula using one or more parameters which represent the state of the light receiving environment.

(Structure)

The timing correction part 57 calculates the correction time on the basis of a strength of incident light which is one of the parameters which represent the state of the light receiving environment. The light detection device 1F according to the sixth exemplary embodiment uses, as the strength of incident light, a height of the peak edge value or a maximum edge value Emax. In order to obtain the strength of incident light, it is acceptable to use a height of the level value or a change rate of the level value or the edge value. For example, this change rate represents a slope of a tangent line at a specific point in a graph of the level value or the edge value shown in FIG. 4.

FIG. 13 is a view showing a SPAD response example when the light detection device 1F receives the incident light, i.e. the incident light having a strong intensity. As shown in FIG. 13, when the incident light or incident photons has a relatively strong intensity, the time difference ΔTA between a timing A1 and a timing A2 becomes a relatively small value. The amount of incident light becomes a peak value at the timing A1. The edge value becomes a maximum value Emax at the timing A2.

When the light receiving parts 2, i.e. the SPADs 4 receive strong light, because the amount of the incident light is large, many SPADs 4 receive and detect the incident light within a short period of time, and the number of the SPADs 4 responding to the incident light increases and the light receiving parts 2 transmit many pulse signals to the corresponding edge detection circuits 20A.

FIG. 14 is a view showing a SPAR response example when the light detection device receives incident light having a weak intensity. As shown in FIG. 14, when the incident light or light have a relatively weak intensity, the time difference ΔTB between a timing B1 and a timing B2 becomes larger than the time difference ΔTA. The amount of incident light becomes a peak value at the timing B1. The edge value becomes a maximum value Emax at the timing B2.

When the light receiving parts 2, i.e. the SPADs 4 receive weak light, because the amount of the incident light is small, the SPADs 4 gradually respond to the incident light within a long period of time.

As previously described, the number of responses represents the number of times for the SPADs to detect, i.e. to respond to incident light.

In the example shown in FIG. 13 in which the strength of incident light is strong, the number of responses in the period [A] is 8. The strength of incident light becomes a peak value in the period [B]. The strength of incident light becomes weak in the period [C]. As shown in FIG. 13, the number of responses in the period [B] is increased by 4 from the number of responses in the period [A]. As shown in FIG. 13, the number of responses in the period [C] is increased by 3 from the number of responses in the period [B].

In the example shown in FIG. 14 in which the strength of the incident light is weak, the number of responses in the period [A] is 1. As shown in FIG. 14, the number of responses in the period [B] is increased by 3 from the number of responses in the period [A]. As shown in FIG. 14, the number of responses in the period [C] is increased by 4 from the number of responses in the period [B].

That is, when the light receiving parts 2 receives strong incident light at the initial light receiving state, many SPADs 4 respond to the incident light. After the initial light receiving state, the number of times for the SPADs 4 to respond to the incident light is reduced. As a result, there is a time difference between the timing A2 and the timing B2, wherein the edge value becomes the maximum value Emax at the timing A2 when the incident light is strong, and the edge value becomes the maximum value Emax at the timing B2 when the incident light is weak.

Figure 15:
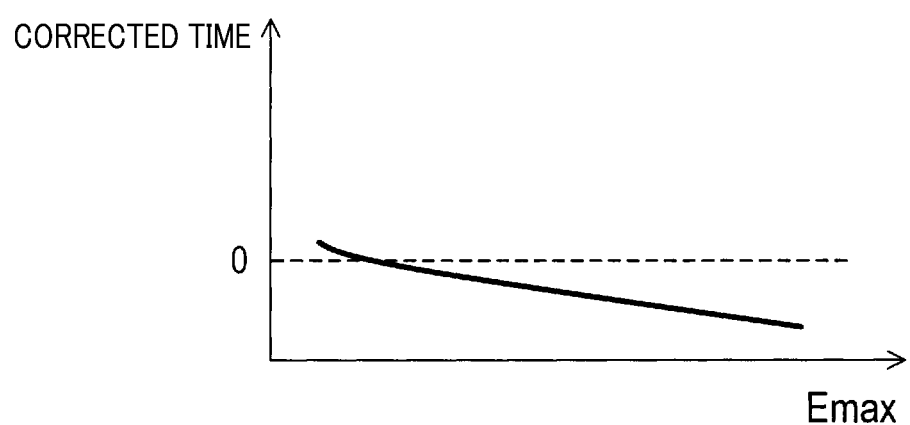
FIG. 15 is a view showing a correction map which represents a relationship between a correction time and a maximum value of an edge value to be used by a timing correction part in the light detection device according to the sixth exemplary embodiment of the present invention.

FIG. 15 is a view showing the correction map which represents a relationship between a correction time and a maximum value of an edge value to be used by the timing correction part 57 in the light detection device 1F according to the sixth exemplary embodiment of the present invention. The timing correction part 57 calculates the correction time which corresponds to the strength of incident light, or incident light by using the correction map shown in FIG. 15. In the correction map shown in FIG. 15, the greater the maximum value Emax of the edge value becomes, the more the correction amount is reduced. When the maximum value Emax of the edge value becomes larger, the number of the SPADs 4, which have detected the incident light, is saturated at the timing before the timing when the amount of the incident light becomes a peak value. In this case, the timing when the number of the SPADs 4 is saturated is changed before the timing when the edge value becomes the maximum edge value.

(Effects)

The light detection device 1F according to the sixth exemplary embodiment has the following effects (6a) and (6b) in addition to the effect (1a) of the light detection device 1A according to the first exemplary embodiment.

(6a) In the structure of the light detection device 1F according to the sixth exemplary embodiment previously described, the timing correction part 57 is configured to calculate the correction time in accordance with the state of the light receiving environment in which the light detection device 1F is placed. As previously explained, the correction time is used for correcting the timing E when the number of edges becomes a peak value.

Because the light detection device 1F having the structure previously described can calculate the correction time, this structure makes it possible to correctly estimate the light detection timing with high accuracy.

(6b) In the structure of the light detection device 1F according to the sixth exemplary embodiment previously described, the timing correction part 57 is configured to calculate the correction time in accordance with the strength of incident light which is irradiated to the light detection device 1F. Because each of the SPADs 4 has a tendency to enter its early saturation and this changes the timing when the edge value becomes the maximum value, the timing correction part 57 corrects the timing E on the basis of the behavior of the SPADs 4.

According to the structure of the light detection device 1F previously described, because the correction time is corrected in accordance with the strength of incident light irradiated into the light detection device 1F, it is possible to correctly calculate the correction time in response to the change of the timing when the number of edges becomes the maximum value. This structure of the light detection device 1F makes it possible to estimate the light detection timing with higher accuracy.

The concept of the present invention is not limited by the structures disclosed in the first to sixth exemplary embodiments. It is possible for the timing correction part 57 to correct a temporary timing, instead of correcting the timing E, which satisfies a predetermined condition of a time series change of the number of edges. Specifically, it is sufficient for such a temporary timing to be used for correctly detecting the light detection timing. For example, there are, as the temporary timing, a timing when the level value becomes a maximum level value, and a timing when the level value is increased and the increased level value reaches a predetermined value.

(Other Modifications)

A description will be given of various modifications (7c) to (7d) of the light detection devices 1A to 1F according to the first to sixth exemplary embodiments.

(7a) The light detection device 1D according to the fourth exemplary embodiment previously described executes the software programs so as to obtain the strength of incident light in accordance with the number of edges. Further, the light detection device 1E according to the fifth exemplary embodiment previously described uses the hardware circuit so as to obtain the strength of incident light in accordance with the number of edges. However, the concept of the present invention is not limited by the fourth exemplary embodiment and the fifth exemplary embodiment. For example, it is possible to combine the hardware circuit and the use of the software programs so as to obtain the strength of incident light in accordance with the number of edges.

(7b) In the first to sixth exemplary embodiments, the number of edges is detected by using the edge detection circuits 20A, 20B, 20C, 20D and 20E. However, the concept of the present invention is not limited by the first exemplary embodiment to the sixth exemplary embodiment. For example, it is possible to use specific circuits corresponding to the level detection circuits 70 shown in FIG. 9 used in the light detection device 1D according to the fourth exemplary embodiment, instead of using the edge detection circuits 20A, 20B, 20C, 20D and 20E. In this structure, it is acceptable for the arithmetic unit 50 to execute software programs so as to detect the edges by using an increased level value as the total number of edges.

(7c) It is acceptable to use a plurality of components so as to realize a plurality of functions provided by one component in the light detection device. It is also acceptable to use a plurality of components so as to realize one function provided by one component in the light detection device. Further it is acceptable to use one component so as to realize a plurality of functions provided by a plurality of components in the light detection device. Still further, it is acceptable to use one component so as to realize one function provided by a plurality of components in the light detection device. Still further, it is acceptable to eliminate one or some components from the structure of the light detection device. It is acceptable to combine some components in the light detection devices according to the first to sixth exemplary embodiments.

(7d) It is possible to form a system having each of the light detection devices 1A to 1F as modification of the present invention. It is possible to use programs, to be executed by a computer system, so as to realize the functions of each of the light detection devices F1 to 1F. Further, it is possible to use a non-transitory computer readable storage medium for storing programs for causing a central processing unit in a computer system to execute the functions of each of the each of the light detection devices F1 to 1F. It is also possible to use a light detection method so as to realize the functions of each of the each of the light detection devices F1 to 1F.

(Correspondence)

The quench resistances 6 and the pulse signal output parts 8 in a plurality of the light receiving parts 2 correspond to a signal output part.

A plurality of the edge detection circuits 20A, 20B, 20C, 20D and 20E, and the addition unit 40 correspond to a plurality of edge detection parts. Each of the edge detection circuits 20A, 20B, 20C, 20D and 20E, and a plurality of the level detection circuits 70 corresponds to a clock synchronization circuit. A plurality of the edge detection circuit 20C, a plurality of the level detection circuits 70, and the addition unit 40 correspond to a response number detection part.

The peak detection part 56 and the timing correction part 57 correspond to a timing detection part and a light strength detection part. Further, the timing correction part 57 corresponds also to a correction calculation part. As previously described, the incident light corresponds to incident photons.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalents thereof.

What is claimed is:

1. A light detection device capable of detecting incident photons as incident light, comprising:

a plurality of light receiving parts, each of the plurality of light receiving parts comprising a single photon avalanche diode configured to detect incident photons and a signal output part configured to generate and transmit a pulse signal when the single photon avalanche diode detects and responds to the incident photons; and a plurality of edge detection parts, arranged in one to one correspondence with the plurality of light receiving parts, configured to detect the number of edges, each edge representing a change from a first state to a second state, the signal output part transmitting no pulse signal in the first state, and the signal output part transmitting the pulse signal to the corresponding edge detection part in the second state during a period from a previously received clock signal to a currently received clock signal every time each of the plurality of edge detection parts receives the clock signal transmitted at a predetermined period.

2. The light detection device according to claim 1, wherein each of the plurality of edge detection parts comprises a clock synchronization circuit capable of detecting the edges.

3. The light detection device according to claim 1, further comprising a response number detection part configured to detect the number of the single photon avalanche diodes which respond to the incident photons on the basis of the number of the pulse signals every time it receives the clock signal transmitted at the predetermined period.

4. The light detection device according to claim 2, further comprising a response number detection part configured to detect the number of the single photon avalanche diodes which respond the incident photons on the basis of the number of the pulse signals every time it receives the clock signal transmitted at the predetermined period.

5. The light detection device according to claim 3, wherein the response number detection part further comprises a clock synchronization circuit capable of detecting the pulse signals transmitted from the plurality of edge detection parts.

6. The light detection device according to claim 3, further comprising a timing detection part configured to detect a light detection timing which represents the timing when the light detection device detects the incident light as the incident photons on the basis of an edge detection timing when the plurality of edge detection parts detect the edges and the number of the edges every the edge detection timing.

7. The light detection device according to claim 5, further comprising a timing detection part configured to detect a light detection timing which represents the timing when the light detection device detects the incident light as the incident photons on the basis of an edge detection timing when the plurality of edge detection parts detect the edges and the number of the edges every the edge detection timing.

8. The light detection device according to claim 6, further comprising a timing correction part using a temporary timing which satisfies a predetermined condition regarding a time-series change of the number of edges, detects a correction time which represents a time difference between the temporary timing and a true timing when an amount of the incident light becomes a maximum value, and the timing correction part corrects the temporary timing by using the correction time difference as the detection timing, and uses the corrected temporary timing as the light detection timing.

9. The light detection device according to claim 8, further comprising a correction calculation part configured to calculate the correction timing in accordance with light receiving environment of the light detection device.

10. The light detection device according to claim 9, wherein the correction calculation part calculates the correction timing in accordance with an amount of incident light irradiated to the light detection device.

11. The light detection device according to claim 8, further comprising a light strength detection part configured to detect a strength of incident light in accordance with the number of responses which represents the number of the single photon avalanche diodes which respond to the incident light as the incident photons.

12. The light detection device according to claim 11, wherein the light strength detection part detects, as the strength of incident light, the number of responses at a timing which is delayed from the timing when the edge detection part detects the edges.

* * * * *